United States Patent [19]

Nuver

[11] 4,220,895
[45] Sep. 2, 1980

[54] NON-INTERFERING, OVERLAPPING HIGH FREQUENCY SIGNALLING FOR LAMP DIMMER CIRCUIT

[75] Inventor: Eric L. H. Nuver, San Marcos, Tex.

[73] Assignee: Esquire, Inc., New York, N.Y.

[21] Appl. No.: 936,883

[22] Filed: Aug. 25, 1978

[51] Int. Cl.² .............................................. H05B 41/38
[52] U.S. Cl. .................................... 315/195; 315/144; 315/DIG. 7; 328/61
[58] Field of Search .................. 328/61; 307/261, 240, 307/262; 315/137, 141, 144, 145, 194, 195, 199, 254, 258, 283, 289, 297, DIG. 4, DIG. 7, 291

[56] References Cited

U.S. PATENT DOCUMENTS

| | | | |
|---|---|---|---|
| 3,548,342 | 12/1970 | Maxey | 328/61 |
| 3,816,794 | 6/1974 | Snyder | 315/194 |
| 3,894,265 | 7/1975 | Holmes et al. | 315/144 |

*Primary Examiner*—David K. Moore

*Attorney, Agent, or Firm*—Frank S. Vaden, III

[57] ABSTRACT

A network for the development of a square wave in a first time period as set by the timing occurrence of a first voltage to a predetermined threshold level and another network for the development of a square wave in a second time period as set by the timing occurrence of a second voltage to a predetermined threshold level. One square wave is chopped at a high frequency rate and the second square wave is chopped at the same high frequency rate, but by a chopping signal which is polarity inverted in phase from the first chopping signal. One of the chopped signals is polarity inverted before being combined with the other chopped signal to form a composite voltage. Separate lamp control networks can select between the two chopped signals to control dimming networks. The two chopped signals can overlap in time occurrence without interfering with the operation of each other.

12 Claims, 4 Drawing Figures

NON-INTERFERING, OVERLAPPING HIGH FREQUENCY SIGNALLING FOR LAMP DIMMER CIRCUIT

BACKGROUND OF THE INVENTION

1. Field of the Invention

This invention relates to dimmer circuits for lighting systems having multiple lamps, some of which are desirably dimmed differently from others, and more specifically to such a dimmer that operates in conjunction with different high frequency control voltages capable of transmission over a common line.

2. Description of the Prior Art

It is a common technique to provide dimming for lighting circuits through an external control. One system useful in providing dimming for a high intensity discharge lamp, which operates with a ballast, is to provide at least partial current bypass of a ballast element. The bypass is commonly accomplished via the gating of a gated semiconductor.

A description of the operation is provided in U.S. Pat. Nos. 3,816,794 and 3,894,265 and in patent application Ser. No. 927,555 entitled "Optocoupler Dimmer Circuit for High Intensity, Gaseous Discharge Lamp", Nuver, executed July 18, 1978, filed July 24, 1978.

The systems described in the prior art utilize the same originating signals for operating more than one lamp, and therefore, dim these lamps to the same degree or as provided by variable circuit components at the different lamps. If different dimming control signals for different lamps are developed, they are separately transmitted.

Therefore, it is a feature of the present invention to provide improved dimming for adjusting one lamp differently from a second lamp by providing two control signals over a common wire from a common transmission point of origin.

It is another feature of the present invention to provide improved dimming for adjusting one HID lamp differently from another by providing two control signals at a common high frequency, the signals being in bursts suitable for operating in an allowed firing angle of line voltage for operating a partial ballast bypass, but overlapping in occurrence.

SUMMARY OF THE INVENTION

The present invention develops two high frequency voltages of different polarities and at a common frequency, each separate voltage controllable in time occurrence by adjustment of a dc level, the two voltages being suitable for simultaneous transmission on a common line. The time occurrences can readily overlap. The voltages are preferably timed to occur during an allowed firing angle.

In a preferred embodiment, a potentiometer establishes a voltage, which is applied to a timer also having an input from the line voltage. The output of the timer is applied to a differentiator and then to a second timer having a standard dc level applied as its second input. The second timer produces an output which is a square wave pulse occurring at selected time T1 in the allowed firing angle. A similar network independently produces an output which is a square wave pulse occurring at selected time T2 in the allowed firing angle.

An oscillator presents an output to a first NAND network with the first square wave pulse. In chopper-like fashion, an output is produced at the frequency of the oscillator over the period of the first square wave.

A complementary oscillator output is applied to a second NAND network with the second square wave pulse to produce an output at the frequency of the oscillator over the period of the second square wave, the high frequency cycles occurring exactly 180 degrees from or intermediate those from the first NAND network.

One of the chopped high frequency voltages is inverted and applied to an AND network together with the other of the chopped high frequency voltages. Since the cycles of one high frequency is exactly intermediate the cycles of the other, the time period of one may overlap the period of the other without interfering with either.

The composite voltages just described can be transmitted to the lamp networks where the signals are utilized for dimmer control purposes, either on separate wires or using the wire used for supplying line voltage. At a lamp network, the signal is separated from the extraneous signals, including the high frequency of the polarity not to be used, in a filter network also including a polarity-eliminating diode. The resulting signal can then be used, for example, in one type of HID lamp network to control the gating of a gated semiconductor connected for at least partial bypass of a ballast element. It can also be used in other types of HID or other type lamp networks not having such a ballast connection to provide dimming in other fashions. In related fashion, another signal is developed from the opposite polarity, high-frequency signal to control the dimming of a lamp or lamps in another dimming network.

BRIEF DESCRIPTION OF THE DRAWINGS

So that the manner in which the above-recited advantages and objects of the invention, as well as others which will become apparent, are attained and can be understood in detail, more particular description of the invention briefly summarized above may be had by reference to the embodiments thereof which are illustrated in the appended drawings, which drawings form a part of this specification. It is noted, however, that the appended drawings illustrate only typical embodiments of the invention and are therefore not to be considered limiting of its scope, for the invention may admit to other equally effective embodiments.

In the drawings.

DESCRIPTION OF THE PREFERRED EMBODIMENTS

A patent application entitled "Optocoupler Dimmer Circuit for High Intensity, Gaseous Discharge Lamp", Nuver, executed July 18, 1978 and assigned to the same assignee as the present application, describes the providing of dimming of a high intensity discharge (HID) lamp utilizing an optocoupler connection. Basically, the circuits therein described utilize an optocoupler connection for gating a gated semiconductor device, which, in turn, causes at least partial bypass of a ballast element connected to the HID lamp. When current is bypassed around a portion of the ballast, for example, one of the two series-connected elements or windings, full bright current is applied to the lamp. When current is not bypassed therearound, then the entire inductive load is connected to the lamp, thereby reducing the lamp current to the full dim current level. In practice, bypass operation occurs for only part of each cycle of voltage applied to the lamp when it is desirable to provide less than full dimming. The period of bypass time determines the amount of dimming. The timing of bypass occurs during the allowable firing angle of operation, which generally cannot be within either the first 30 degrees of the half cycle of lamp voltage or the last 30 degrees thereof.

A more complete description of the timing operation is found in U.S. Pat. Nos. 3,816,794 and 3,894,265, and in the above-identified patent application, all incorporated herein by reference and made a part hereof for all purposes.

As is noted elsewhere, the example dimming arrangement just described is only one method of providing dimming to an HID lamp. The invention described herein is useful in conjunction with such a network or with other types of HID and other lamp dimming networks.

An optocoupler is an optically isolated driver device having a driver portion connected to the gate of the gated semiconductor. Typically, this driver device is a phototransistor, phototriac, photo-FET, photo-diode or a photo-SCR. The optocoupler also includes a receiver portion optically coupled to the driver portion for switching the driver portion on during desirable periods of time for gating the gated semiconductor. Again, a more complete description of the operation of the optocoupler may be found in the above-identified patent application.

Figure 1:
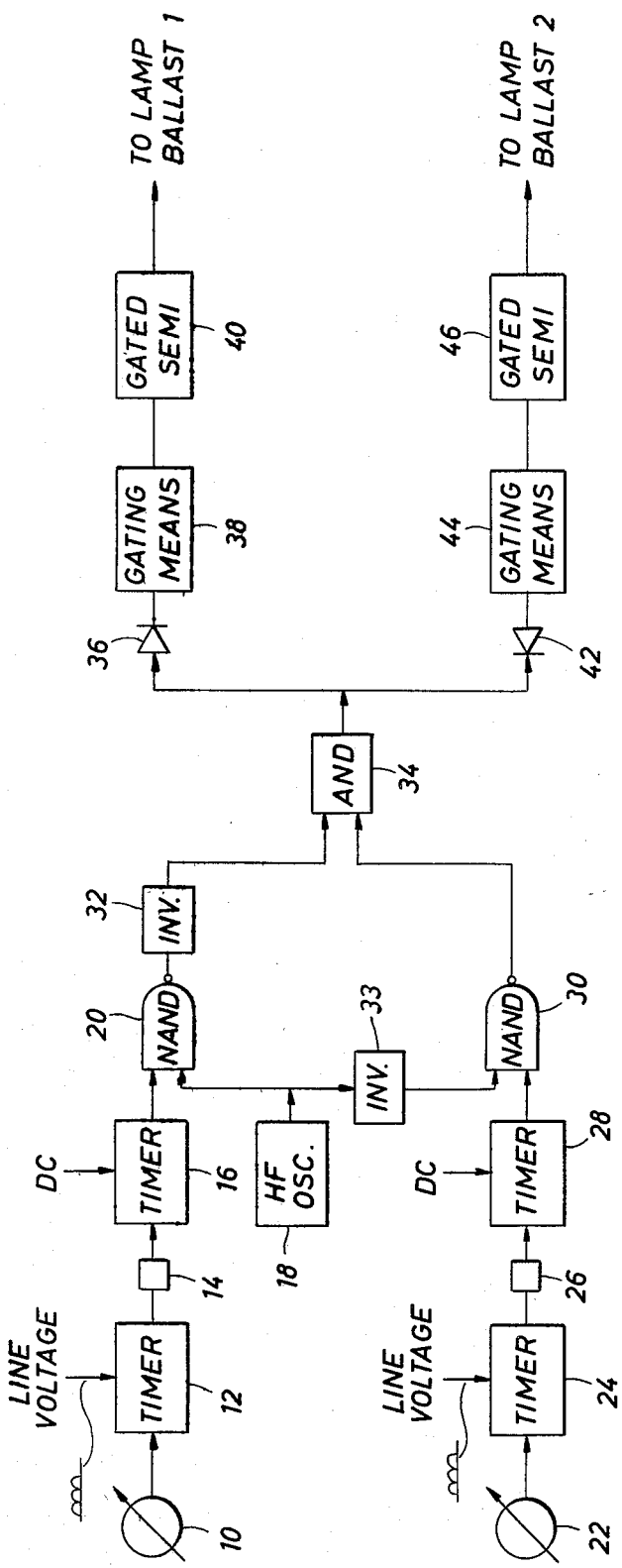
FIG. 1 is a block diagram of a preferred embodiment of the present invention.

Now referring to FIG. 1, a block diagram of a circuit suitable for providing the gating in accordance with the present invention is shown. A settable dc voltage is determined by potentiometer 10 connected to timer 12, to which line voltage is also applied after full wave rectification as a reference. Timing control means other than potentiometer 10 may be used. Operationally, the timing is achieved by the length of time an applied voltage takes to reach a predetermined voltage level sufficient to actuate timer 12.

Timer 12 is typically a standard Model 555 timer produced by many manufacturers. An applied reference signal produces a first polarity output or high voltage. An opposite or low-voltage polarity output is produced at a time thereafter determined by an applied dc level. So that there will be a signal produced from timer 12 each half cycle of line voltage, line voltage is applied to a rectifier (not shown), which supplies a full-wave rectified input to timer 12 to produce the first polarity output. The second polarity output is produced thereafter as determined by the voltage setting of potentiometer 10. A relatively high voltage setting produces an opposite polarity output occurring soon after the first polarity output and a relatively low voltage setting produces an opposite polarity output at a time proportionately later.

The square wave output from timer 12 is applied to differentiator 14. Hence, each time there is a polarity change in the output from timer 12, there is a spike output from the differentiator. A negative-going polarity change produces a negative spike.

A relatively constant level dc voltage is applied to timer 16 as one input thereto and the spike output from differentiator 14 is applied as the other input to timer 16, in this case the reference input. It should be noted that timer 16 is only sensitive to spikes in one polarity and, hence, it ignores the spikes occurring at the zero reference time of timer 12. Since a constant dc level is applied as the other input, the output is a square wave pulse of uniform width, starting at a time determined by the setting of potentiometer 10.

Figure 2:
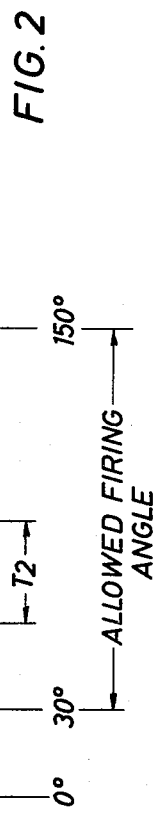
FIG. 2 is a timing diagram of signal development resulting from the circuit shown in FIG. 1.

High frequency oscillator 18, which may be operated at a frequency anywhere in a range between about several KHz and 1 MHz, is applied as one input to NAND network 20, the square-wave output from timer 16 being applied as the other input to NAND network 20. The resulting output is a chopped square wave at the frequency of oscillator 18 occurring in time T1 as shown in FIG. 2.

In similar fashion, a variable timing control 22 is applied as one input to timer 24, whose other input is the fully rectified line voltage. The output of timer 24 is applied to differentiator 26, the output of which is applied to timer 28, the other input to which is a constant dc level. The square wave output occurring at time T2 is applied to NAND network 30. The output of oscillator 18 is applied to inverter 33, whose output is then applied to NAND network 30. This places the negative cycles of the output from inverter 33 in the same position as the positive cycles of the output directly from oscillator 18. The output from NAND network 30 is a chopped dc voltage at time T2.

NAND networks 20 and 30 both have the effect of not only producing chopped voltages in the manner just described, but of inverting their respective outputs. Therefore, inverter 32 receives the output from NAND network 20 and produces an output progressing from a zero or common level to a positive level and back to a zero level, while NAND network 30 produces an output progressing from a common level to a negative level and back to the common level. The effect of using the inverted output from oscillator 18 as the chopping input to NAND network 30 while using the non-inverted output from the same oscillator as the chopping input to NAND network 20 has the effect of producing a combined voltage output (after the output from NAND network 20 has been inverted by inverter 32) as shown in FIG. 2 where the cycles of the negative-going signal are intermediate the cycles of the positive-going signal. However, in time, positive signal burst T1 is variable in the allowed firing range (within 30°-150° points of each half cycle of line voltage for purposes described in U.S. Pat. Nos. 3,816,794 and 3,894,265 and the above-identified patent application).

The outputs from NAND network 30 and inverter 32 are combined in AND network 34 to place the signals just described on a common line for transmission to the respective ballast-and-lamp networks, which may be at a remote location from the signal development network just described. In any event, the signal is applied to diode 36 which passes the positive-going signals in time T1 to gating means 38 for activating gated semiconductor 40 connected to a first lamp ballast network. In similar fashion, the output of AND network 34 is applied to diode 42, which passes the negative-going signals in time T2 to gating means 44, which, in turn, activates gated semiconductor 46 connected to a second lamp ballast network.

Figure 3:
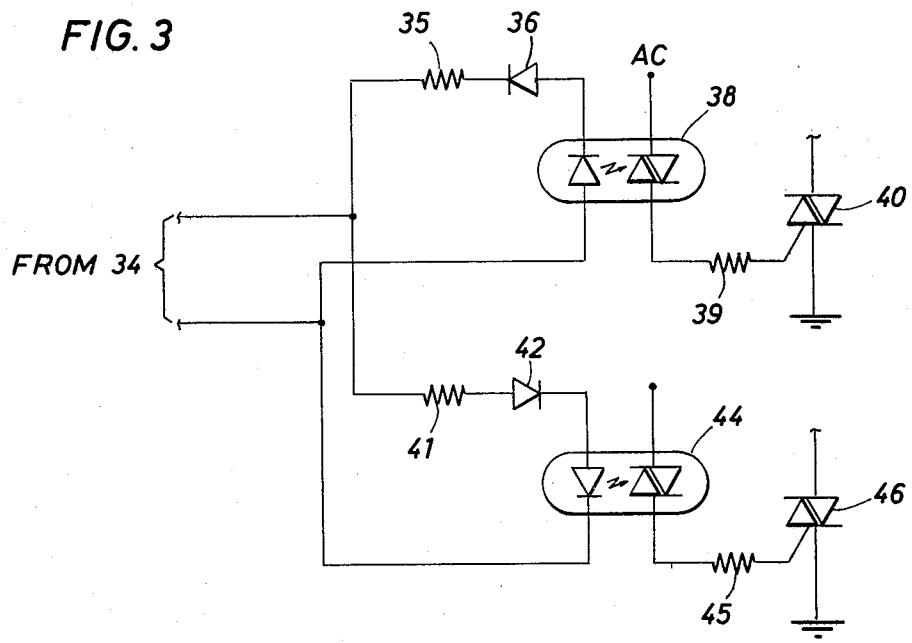
FIG. 3 is a partial schematic diagram of the lamp circuit portion of a preferred embodiment of the present invention.

A more detailed observation of the gating process may be had by reference to FIG. 3. The composite signal arrives on a line connected to series current limiting resistors 35 and 41 in the respective ballast-and-lamp networks. The positive portions of the composite signals are passed by diode 36 to the light emitting diode element of optocoupler 38. The photodrive element of the optocoupler, illustrated as a phototriac, is connected to the gate lead of triac 40 through resistor 39, triac 40 being connected to the first lamp ballast network for partial bypass operation.

The negative portions of the composite signals are passed by diode 42 to the light emitting diode element of optocoupler 44. The phototriac thereof is connected to the gate lead of triac 46 through resistor 45, triac 46 being connected to the second lamp ballast network for partial bypass operation. The return leads from the LED portions of the two optocouplers are connected as a gate common connection.

In operation, when an LED is "on", it causes latching on of the gated semiconductor connected to its corresponding photodrive element until the line voltage ac applied therethrough goes through its sequencing to its alternate half cycle. The turn on occurs at the beginning of the time period indicated in FIG. 2, if not on the first high frequency cycle, then on the next one.

Figure 4:
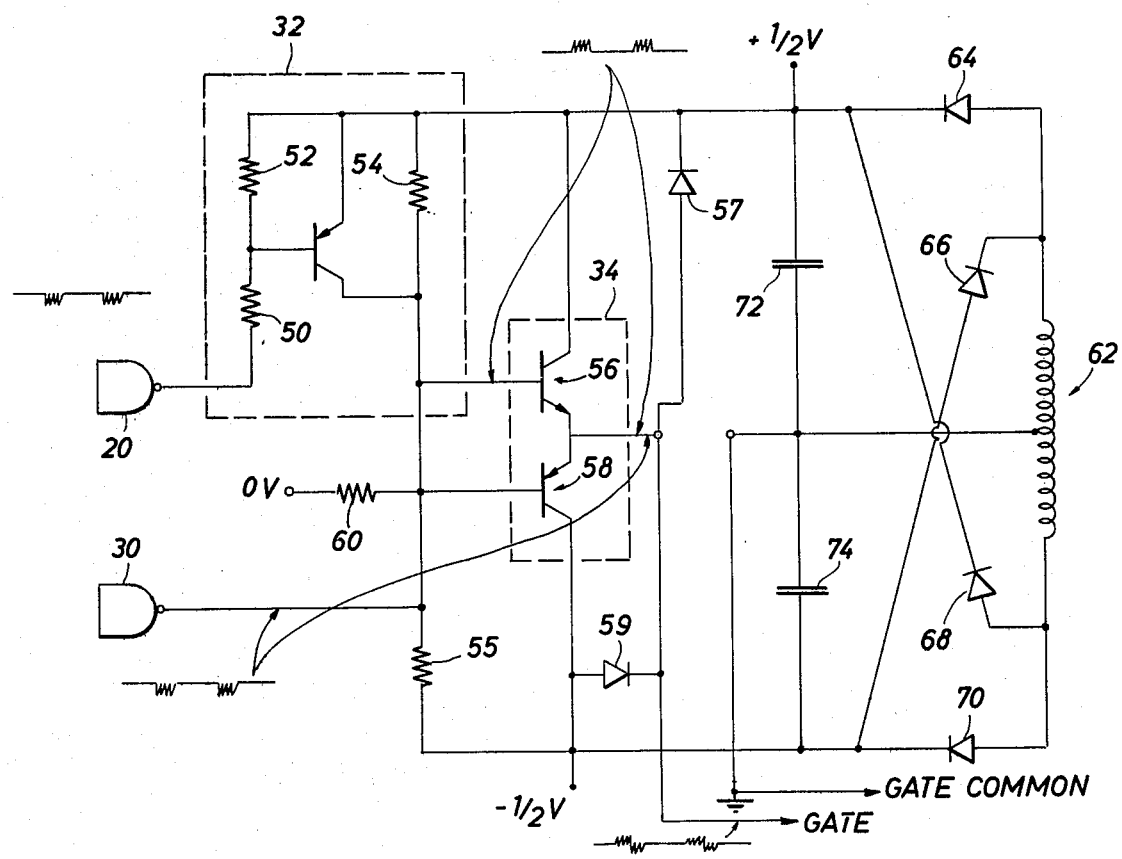
FIG. 4 is a partial schematic diagram of the part of a preferred embodiment of the present invention where the composite signal development occurs.

Now referring to FIG. 4, an expanded circuit diagram of that part of the gate signal development circuit is shown where the composite gate signals are combined. The chopped gate signal from NAND network 20 is an inverted chopped signal occurring at time T1. Applicaiton via resistor 50 to the base of a PNP transistor results in an inverted or righted output. Resistors 50 and 52 provide bias resistors for the base and emitter, respectively. Resistor 54 establishes the bias voltage for transistor 56 and substantially identical resistor 55 establishes the bias voltage for transistor 58.

The output of NAND network 20 is negative-going, but, as discussed above, this is the proper direction therefor in its use application.

The signals are applied to the bases of transistors 56 and 58, one being an NPN transistor and the other a PNP transistor, the output being from a joint connection of their emitters. A resistor 60 is connected to the bases of these transistors and to a voltage level that is one-half that applied across the total collector-to-collector of both transistors. Resistor 60 does not have to be present since the mid-point is the junction between resistors 54 and 55 or the bases of transistors 56 and 58.

Diode 57, connected from the common emitter connection of transistors 56 and 58 to the collector of transistor 56, and diode 59, connected from the common emitter connection of transistor 58 to the collector emitter connection of transistor 58 to the collector of transistor 58, clamp inductive peaks that may occur to the $+\frac{1}{2}$-volt and $-\frac{1}{2}$-volt levels, respectively, as shown.

This total operating voltage level is established by line transformer 62, a rectifier bridge comprising diodes 64, 66, 68 and 70 and filter capacitors 72 and 74 connected to the transformer center tap and the non-transformer connections of the bridge. The center position between these capacitors, the same connection as the center tap of the transformer, provides the gate common connection.

As illustrated in FIG. 4, the gate output is a combined voltage as described hereinabove. The output level varies between a zero voltage level, to one-half of the total rectified output, to the total rectified level and may be referred to as a tri-state gate output.

The description has been given with respect to the partial bypass operation of a ballast network connected to a high intensity discharge (HID) lamp. Actually, the development of a gating signal is equally suitable for application to a gated semiconductor that is part of a fluorescent lamp circuit or even an incandescent lamp circuit.

The operation of an optocoupler switch has been described above. However, it is well known that a partial bypass of a ballast element in a lamp circuit does not have to utilize an optocoupler. For example, a gate transformer connected to diodes 36 and 42 can be used instead, as set forth in the patents identified above. Other schemes are available as well.

The variable voltage setting for positioning times T1 and T2 is illustrated as being determined by potentiometers 10 and 22, respectively. In practice, this variable voltage setting can be derived from a remote signal, a complex manual or automatic system or any type of compatible network operable with the remainder of the circuitry described above.

It is also apparent that the signal development part of the circuit can be at a central or master location and the signals therefrom "transmitted" to be received at individual lamp-and-ballast networks remotely located therefrom.

While particular embodiments of the invention have been shown and described, it will be understood that the invention is not limited thereto, since many modifications may be made and will become apparent to those skilled in the art. For example, for non-HID circuits it is possible to create signal bursts and to combine them in the manner described hereinabove without reference to operation in an allowed firing angle of the applied line voltage. Also, gated means connected to HID or other lamps do not have to be connected for partial ballast bypass operation, as explained above with respect to the exemplary circuit.

It is further apparent that more than one lamp network may be operated from either or both of the two chopped signals. Also, the composite high frequency signals can be transmitted from the network of origin to the lamp networks on separate wires or via the same wires providing line voltage. In the latter case, a high pass filter would be provided in the network utilizing the control voltage to filter out line and common noise frequencies.

What is claimed is:

1. A circuit for developing a composite signal comprising
    a first and second chopped square wave capable of overlapping in time occurrence without interference, comprising
        first means for producing a first square wave at a first time occurrence,
        second means for producing a second square wave at a second time occurrence,
        high frequency means having a first output and a second output complementary to said first output,
        a first chopper connected to receive said first square wave and said first output of said high frequency means to produce a first high frequency chopped voltage, a second chopper connected to receive said second square wave and said second output of said high frequency means to produce a second high frequency chopped voltage, a polarity inverter connected to one of said first and second choppers, and an AND network connected to said polarity inverter and the other of said first and second choppers not connected to said polarity inverter, the output of said AND network producing a composite of said two high frequency chopped voltages.

2. A circuit in accordance with claim 1, and including a first timing adjustment network connected to said first means including a variable timing control, the time at which the control reaches a predetermined voltage level determining the position of said first square wave at said first time occurrence, and a second timing adjustment network connected to said first means including a variable timing control, the time at which the control reaches a predetermined voltage level determining the position of said second square wave at said second time occurrence.

3. A circuit for providing a first burst of high frequency voltage of first polarity and a second burst of high frequency voltage of second polarity, said first burst and said second burst being independently variable in time, individual overlapping cycles of said first burst occurring intermediate said second burst, comprising means for providing a first pulsed square wave voltage at the time of occurrence for said first burst, means for providing a second pulsed square wave voltage at the time of occurrence for said second burst, and chopper means operating at a high frequency and connected to said first square wave voltage means and said second square wave voltage means for providing high frequency voltages at opposite polarities and a high frequency oscillator connected to said chopper means.

4. A circuit for providing a first burst of high frequency voltage of first polarity and a second burst of high frequency voltage of second polarity, said first burst and said second burst being independently variable in time, individual overlapping cylces of said first burst occurring intermediate said second burst, comprising means for providing a first pulsed square wave voltage at the time of occurrence for said first burst, means for providing a second pulsed square wave voltage at the time of occurrence for said second burst, a high frequency oscillator, first NAND means connected to receive the output from said first pulsed square wave voltage means and the output from said oscillator, an inverter connected to said oscillator, second NAND means connected to receive the output from and second pulsed square wave voltage means and said inverter, and AND means connected to said first NAND means and said second NAND means to provide two voltages of opposite polarity of common frequency and capable of occurring in time overlap.

5. In a system for providing lamp dimming to a first lamp circuit and a second lamp circuit, each of said lamp circuits including gated means connected to the lamp for regulating the amount of current through the lamp, the improvement of a circuit for providing a first burst of high frequency voltage of first polarity for gating the gated means of said first lamp circuit and a second burst of high frequency voltage of second polarity for gating the gated means of said second lamp circuit, said first burst and said second burst being independently variable in time, individual overlapping cycles of said first burst occurring intermediate said second burst, comprising means for providing a first pulsed square wave voltage at the time of occurrence for said first burst, means for providing a seond pulsed square wave voltage at the time of occurrence for said second burst, and chopper means operating at the high frequency and connected to said first square wave voltage means and said second square wave voltage means for providing high frequency control voltages at opposite polarities and a high frequency oscillator connected to said chopper means.

6. In a system for providing lamp dimming to a first lamp circuit and a second lamp circuit, each of said lamp circuits including a ballast connected to the lamp having an element thereof for at least partial current bypass operation, a gated semiconductor connected to the element to provide the current bypass operation, gating means connected to the gate of the gated semiconductor activated by the application of a high frequency control voltage, and a diode connected to said gating means, said diode in said first lamp circuit being oppositely poled from said diode in said second lamp circuit, the improvement of a lamp dimming circuit for providing a first burst of high frequency voltage of first polarity for gating the gating means of said first lamp circuit and a second burst of high frequency voltage of second polarity for gating the gating means of said second lamp circuit, said first burst and said second burst being independently variable in time, individual overlapping cycles of said first burst occurring intermediate said second burst, comprising means for providing a first pulsed square wave voltage at the time of occurrence for said first burst, means for providing a second pulsed square wave voltage at the time of occurrence for said second burst, and chopper means operating at the high frequency and connected to said first square wave voltage means and said second square wave voltage means for providing high frequency control voltages at opposite polarities and a high frequency oscillator connected to said chopper means.

7. In a system for providing lamp dimming to a irst lamp circuit and a second lamp circuit, each of said lamp circuits including gated means connected to the lamp for regulating the amount of current through the lamp, the improvement of a circuit for providing a first burst of high frequency voltage of first polarity for gating the gated means of said first lamp circuit and a second burst of high frequency voltage of second polarity for gating the gated means of said second lamp circuit, said first burst and said second burst being independently variable in time, individual overlapping cycles of said first burst occurring intermediate said second burst, comprising means for providing a first pulsed square wave voltage at the time of occurrence for said first burst, means for providing a second pulsed square wave voltage at the time of occurrence for said second burst, a high frequency oscillator, first NAND means connected to receive the output from said first pulsed square wave voltage means and the output from said oscillator, an inverter connected to said oscillator, second NAND means connected to receive the output from said second pulsed square wave voltage means and said inverter, and AND means operatively connected to said first NAND means and said second NAND means, the output thereof connectable to the diodes in said first and second lamp circuits to provide independent variable gate control voltages of opposite polarity, common frequency and capable of occurring in time overlap to first and second lamp circuits over a common connection.

8. The improvement in accordance with claim 7, and including a second inverter for operatively connecting said AND means to said first NAND means.

9. The improvement in accordance with claim 7, wherein said means for providing a first pulsed square wave includes settable dc voltage means, a first timer connected to said settable means and to the line voltage for providing an output therefrom determined at a time after the zero crossing of the line voltage dependent on the level of dc voltage, a second timer connected to said firt timer for providing a square wave voltage starting at the time of occurrence of the output from said first timer.

10. The improvement in accordance with claim 9, and including a differentiator connected between said first and second timer for providing a sharp spike to said second timer.

11. The improvement in accordance with claim 9, wherein said settable dc voltage means includes a potentiometer.

12. In a system for providing lamp dimming to a first lamp circuit and a second lamp circuit, each of said lamp circuit including a ballast connected to the lamp having an element thereof for at least partial current bypass operation, a gated semiconductor connected to the element to provide the current bypass operation, gating means connected to the gate of said gated semiconductor activated by the application of a high frequency control voltage during the firing angle of line voltage providing power to the ballast and lamp, and a diode connected to said gating means, said diode in said first lamp circuit being oppositely poled from said diode in said second lamp circuit, the improvement of a circuit for providing a first burst of high frequency voltage of first polarity for gating the gating means of said first lamp circuit and a second burst of high frequency voltage of second polarity for gating the gating means of said second lamp circuit, said first burst and said second burst being independently variable in time, individual overlapping cycles of said first burst occurring intermediate said second burst, comprising means for providing a first pulsed square wave voltage at the time of occurrence for said first burst, means for providing a second pulsed square wave voltage at the time of occurrence for said second burst, a high frequency oscillator, first NAND means connected to receive the output from said first pulsed square wave voltage means and the output from said oscillator, an inverter connected to said oscillator, second NAND means connected to receive the output from said second pulsed square wave voltage means and said inverter, and AND means operatively connected to said first NAND means and said second NAND means, the output thereof connectable to the diodes in said first and second lamp circuits to provide independent variable gate control voltages of opposite polarity, common frequency and capable of occurring in time overlap to first and second lamp circuits over a common connection.

* * * * *